United States Patent
Hanberg (10) Patent No.: US 7,319,076 B2
(45) Date of Patent: Jan. 15, 2008

(54) LOW RESISTANCE T-SHAPED RIDGE STRUCTURE

(75) Inventor: Peter J. Hanberg, Søborg (DK)

(73) Assignee: Intel Corporation, Santa Clara, CA (US)

(*) Notice: Subject to any disclaimer, the term of this patent is extended or adjusted under 35 U.S.C. 154(b) by 395 days.

(21) Appl. No.: 10/671,815

(22) Filed: Sep. 26, 2003

(65) Prior Publication Data
US 2005/0070113 A1    Mar. 31, 2005

(51) Int. Cl.
*H01L 21/302* (2006.01)
(52) U.S. Cl. .................. 438/751; 438/39; 438/41; 438/44; 438/697; 438/702; 438/749
(58) Field of Classification Search .......... 438/39, 438/41, 44, 60, 79, 697, 702, 739, 745, 749, 438/750, 751
See application file for complete search history.

(56) References Cited

U.S. PATENT DOCUMENTS

| | | | |
|---|---|---|---|
| 5,889,913 A | | 3/1999 | Tohyama et al. |
| 5,939,737 A | | 8/1999 | Hirano |
| 6,841,814 B2 | * | 1/2005 | Yang .................. 257/290 |
| 2002/0025664 A1 | | 2/2002 | Wakejima et al. |
| 2003/0127668 A1 | | 7/2003 | Yang |
| 2005/0287824 A1 | * | 12/2005 | Shapoval et al. ........... 438/795 |

FOREIGN PATENT DOCUMENTS

| | | | |
|---|---|---|---|
| FR | 2542921 A1 | | 9/1984 |
| JP | 60-083378 | * | 6/1985 |
| JP | 01-244667 | * | 9/1989 |
| JP | 04-329644 | * | 11/1992 |

OTHER PUBLICATIONS

PCT International Search Report and Written Opinion, PCT/US2004/031307, Apr. 11, 2005.

* cited by examiner

*Primary Examiner*—George A. Goudreau
(74) *Attorney, Agent, or Firm*—Blakely, Sokoloff, Taylor & Zafman LLP (57) ABSTRACT

A method and apparatus to provide a low resistance interconnect. A void is defined in the sacrificial layer that is proximate to an active layer. An overgrowth layer is formed in the void and over portions of the sacrificial layer adjacent to the void. A ridge section is defined in the overgrowth layer and portions of the sacrificial layer are removed to define a shank section in the overgrowth layer under the ridge section. The ridge section having a greater lateral dimension than the shank section to reduce electrical resistance between the active layer and electrical interconnects to be electrically coupled to the ridge section.

25 Claims, 8 Drawing Sheets

LOW RESISTANCE T-SHAPED RIDGE STRUCTURE

TECHNICAL FIELD

This disclosure relates generally to semiconductor circuits, and in particular, relates to a low resistance T-shaped ridge structure for reducing the serial resistance in various semiconductor devices.

BACKGROUND INFORMATION

Semiconductor devices have become a ubiquitous aspect of daily life. They are the fundamental building blocks upon which integrated circuit ("IC") technologies are developed and brought to bear in the marketplace. Items such as computers, telecommunication systems, and even home entertainment systems, are built using semiconductor devices. Humans are becoming more and more depending upon IC technologies to increase their efficiencies in the workplace and enjoy home entertainment never before possible.

The aforementioned IC applications have relentlessly marched toward smaller and faster packages. In 1965, Gordon Moore made his famous observation that the number of transistors per IC would experience exponentially growth. Moore's Law has held true to this day, with logic densities doubling approximately every eighteen months.

However, as IC logic densities increase, heat creation and dissipation have become major obstacles to technological advances and the continued fulfillment of Moore's Law. To be sure, heat dissipation has become a major limiting factor to continued advancements in mobile processors (e.g., notebook computers).

Major sources of heat creation are the internal resistances within semiconductor devices and their interconnects. When current flows through a semiconductor device or interconnect having an associated resistance, heat is generated. An undesirable side effect of heat generation is the conversion of electrical and/or optical energy to heat, as well as, thermal-mechanical breakdown of the IC devices themselves. This undesirable conversion results in power loss and a degradation in operating efficiency and even a decrease in signal-to-noise ratio. At the extreme, a complete loss of signal may occur. As such, there is a need to reduce internal resistances associated with semiconductor devices and their interconnects.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

DETAILED DESCRIPTION

Embodiments of an apparatus and method for reducing the serial resistance in a plurality of semiconductor devices, such as laser diodes, electro absorption modulators, photo detectors, optical amplifiers, bipolar junction transistors, and the like, are described herein. In the following description numerous specific details are set forth to provide a thorough understanding of embodiments of the invention. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Figure 1:
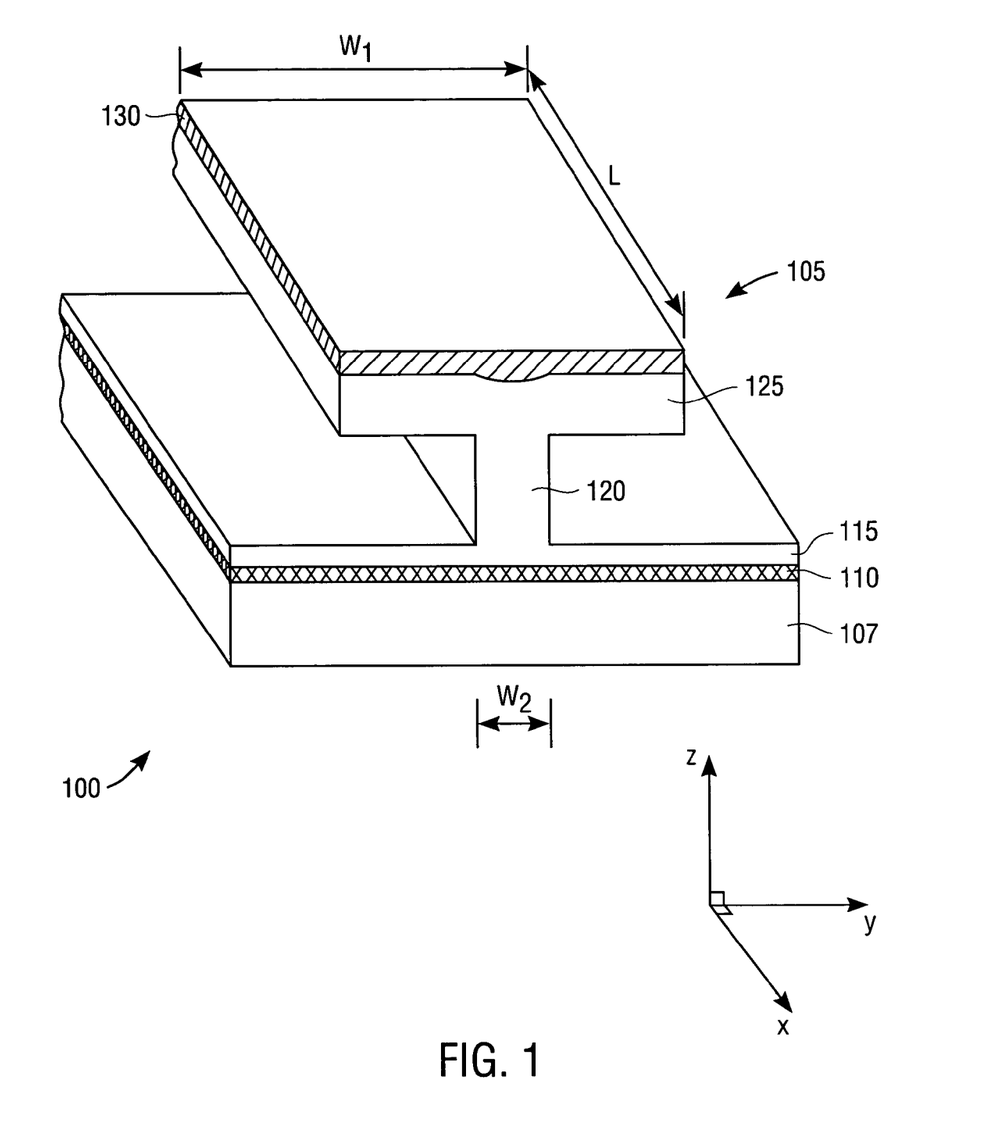
FIG. 1 is a perspective view illustrating a semiconductor device including a low resistance T-shaped ridge structure, in accordance with an embodiment of the present invention.

FIG. 1 is a perspective view illustrating a semiconductor device 100 including a T-shaped ridge structure 105 having a low serial resistance, in accordance with an embodiment of the present invention. The illustrated embodiment semiconductor device 100 includes a substrate layer 107, an active layer 110, an etch stop layer 115, a shaft section 120 having a width $W_2$, a ridge section 125 having a width $W_1$ and a length L, and a conductive contact 130. In the illustrated embodiment, shaft section 120 and ridge section 125 form T-shaped ridge structure 105.

A common problem with integrated circuits is heat generation and dissipation associated with internal resistances of semiconductor devices and electrical losses deriving therefrom. One such internal resistance is the serial resistance resulting from an interconnection between semiconductor devices. Often times, the interconnections between semiconductor devices are constrained in size due to process limitations (e.g., gate width of a transistor) or functional constraints (e.g., width of a planar waveguide to ensure single mode propagation therein). Semiconductor device 100 reduces such electrical losses by providing T-shaped ridge structure 105 to reduce the serial resistance with an electrical interconnect. By providing ridge section 125 having a large cross-sectional area in the X-Y plane, conductive contact 130 has a large surface area to which an electrical interconnect may be coupled and through which current may flow. However, shaft section 120 has a smaller cross-sectional area in the X-Y plane to satisfy design or process constraints where T-shaped ridge structure 105 abuts active layer 110. Furthermore, reducing the cross-sectional area of shaft section 120 reduces undesirable capacitance between shaft section 120 and active layer 110, thereby enabling higher frequency operation of semiconductor device 100. Thus, embodiments of the present invention provide techniques for good electrical contact with upper layer interconnects while also accommodating dimensional constraints associated with lower active layers.

In various embodiments, semiconductor device 100 may be a semiconductor laser, a light emitting diode ("LED"), an electro-absorption modulator, a photo-detector, a photodiode (e.g., P-I-N diode), an optical amplifier, a bipolar junction transistor ("BJT"), an heterojunction bipolar transistor ("HBT"), and the like. The instant list is not intended to be an exhaustive list; but rather, a demonstrative list of implementations for explanation only. In one embodiment, the interface between active layer 110 and etch stop layer 115 under shaft section 120 may form a P-N or N-P semiconductor junction. In one embodiment, active layer 110 may form a gain medium, which can support an electron population inversion when current is driven across active layer 110 from T-shaped ridge structure 105 into substrate layer 107. It should be appreciated that substrate layer 107 may include a number of semiconductor and/or interconnect layers (not shown) for coupling the bottom side of active layer 110 under shaft section 120 to other components of an integrate circuit.

Fabrication processes of many of the above semiconductor devices can limit the level of doping of internal components, thereby increasing their internal resistances. Often times semiconductor devices must include P-type semiconductor material. P-type material is inherently less conductive than N-type material due to the lower carrier mobility of holes verses electrons. For example, an embodiment where semiconductor device 100 includes a laser diode may require T-shaped ridge structure 105 to be P-type semiconductor material. Providing a large cross-sectional area for ridge section 125 helps ameliorate these resistance deficiencies common to many known semiconductor devices.

In the cases where semiconductor device 100 is a laser diode, an electro-absorption modulator, a photo-detector, or an optical amplifier, active layer 110 may act as a planar waveguide having a higher index of refraction than etch stop layer 115 and substrate layer 107. Shaft section 120 increases the effective index of refraction in the portion of active layer 110 directly below shaft section 120, thereby providing lateral confinement to guide light propagating within active layer 110. In one embodiment, lateral confinement regions (not shown) may be formed within active layer 110 to guide light propagating within active layer 110. In one embodiment, a laser cavity (not shown) may be formed within active layer 110 to promote lasing at a specified wavelength. For example, gratings may be defined within active layer 110, one at either end of T-shaped ridge structure 105, to form a distributed Bragg reflector ("DBR") laser or a grating layer may be formed along side active layer 110 about T-shaped ridge structure 105 to form a distributed feedback ("DFB") laser. In one embodiment, quantum wells (not shown) may be formed within active layer 110 beneath shaft section 120 to form an electro-absorption modulator or a semiconductor optical amplifier.

In the cases where semiconductor device 100 includes a BJT or an HBT, the interfaces between etch stop layer 115, active layer 110, and substrate layer 107 may form a P-N-P or an N-P-N semiconductor junction. In these cases, T-shaped ridge structure 105 would form either an emitter or a collector of the transistor device. It should be appreciated that various other interconnects and layers may be added to semiconductor device 100 to appropriately bias the emitter, base, and collector regions of a BJT or HBT embodiment, as would be apparent to one of ordinary skill in the art having the benefit of the instant disclosure.

Thus, semiconductor device 100 may be used in connection with a plurality of different devices, such as those discussed above. T-shaped ridge structure 105 is not limited for use with the devices discussed above. Rather, T-shaped ridge structure 105 may be used in connection with any number of semiconductor devices (e.g., quantum dots, quantum wires, etc. formed within active layer 110) to reduce serial resistances associated with upper level electrical interconnects, while providing design flexibility in terms of width $W_2$.

Figure 10:
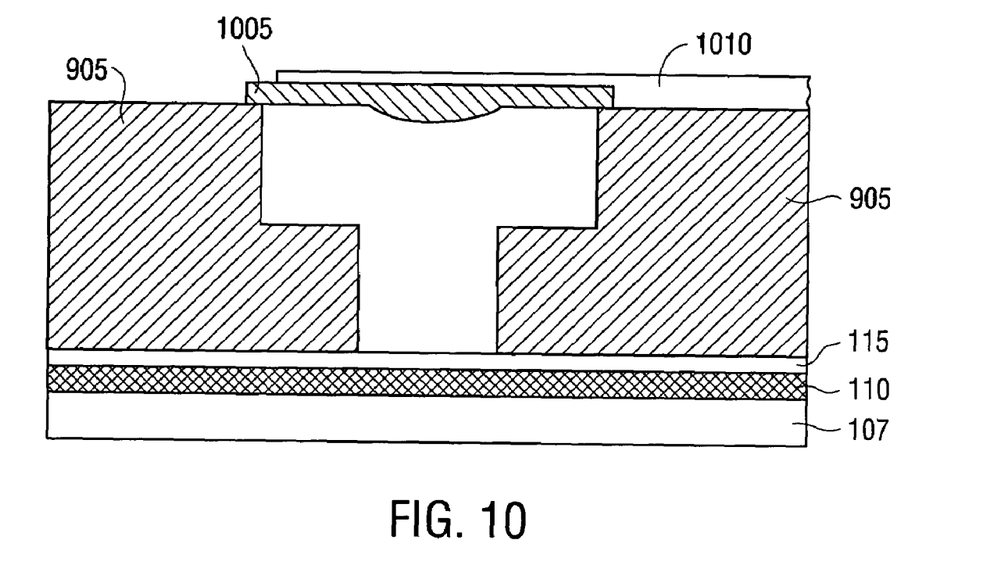
FIG. 10 is a block diagram illustrating a ninth stage of fabricating a low resistance T-shaped ridge structure including forming a conductive contact on top of the low resistance T-shaped ridge structure, in accordance with an embodiment of the present invention.

The resistance of a conductor is inversely proportional to the conductors cross-sectional area as illustrated by Relation 1, $$R = \rho \frac{L}{A} \qquad \text{(Relation 1)}$$

where R is a resistance in ohms ($\Omega$), $\rho$ is the resistivity ($\Omega \cdot m$) of the particular conductor material, L is the length of the conductor, and A is the cross-sectional area of the conductor perpendicular to current flow. As can be deduced from Relation 1, an increase in the cross-sectional area of a given conductor results in a decrease in the resistance R of the conductor. Applying the principles of Relation 1 to semiconductor device 100, it can be seen that increasing the cross-sectional area in the X-Y plane of conductive contact 130 will result in a reduction of the serial resistance of electrical interconnects connected to conductive contact 130. In one embodiment, conductive contact 130 is coupled to other electrical devices via an electrical interconnect, such as a metal trace, polysilicon trace, contact pad, wire lead, highly doped semiconductor regions, and the like (see FIG. 10).

It should be appreciated that the materials and dimensions utilized in the embodiments discussed in connection with FIG. 1 are provided for explanation purposes and that other materials and dimensions may be utilized in accordance with the teachings of the present invention. The relative size, shape and distances between the elements of the various embodiments of the present invention are in some instances exaggerated for clarity and are not necessarily shown to scale. Furthermore, various elements and features of semiconductor device 100 have been excluded from FIG. 1 for the sake of clarity and to more easily convey the ideas of the present invention.

It should be appreciated that although T-shaped ridge structure 105 is illustrated as forming a perfect "T" shape, various embodiments of the present invention may include ridge section 125 being off center of shaft section 120. In fact, embodiments of the present invention include T-shaped ridge structure 105 forming an inverted "L" shape. For the purposes of this disclosure, reference to T-shaped ridge structure 105 is to include embodiments where ridge section 125 is off center of shaft section 120.

Figure 2:
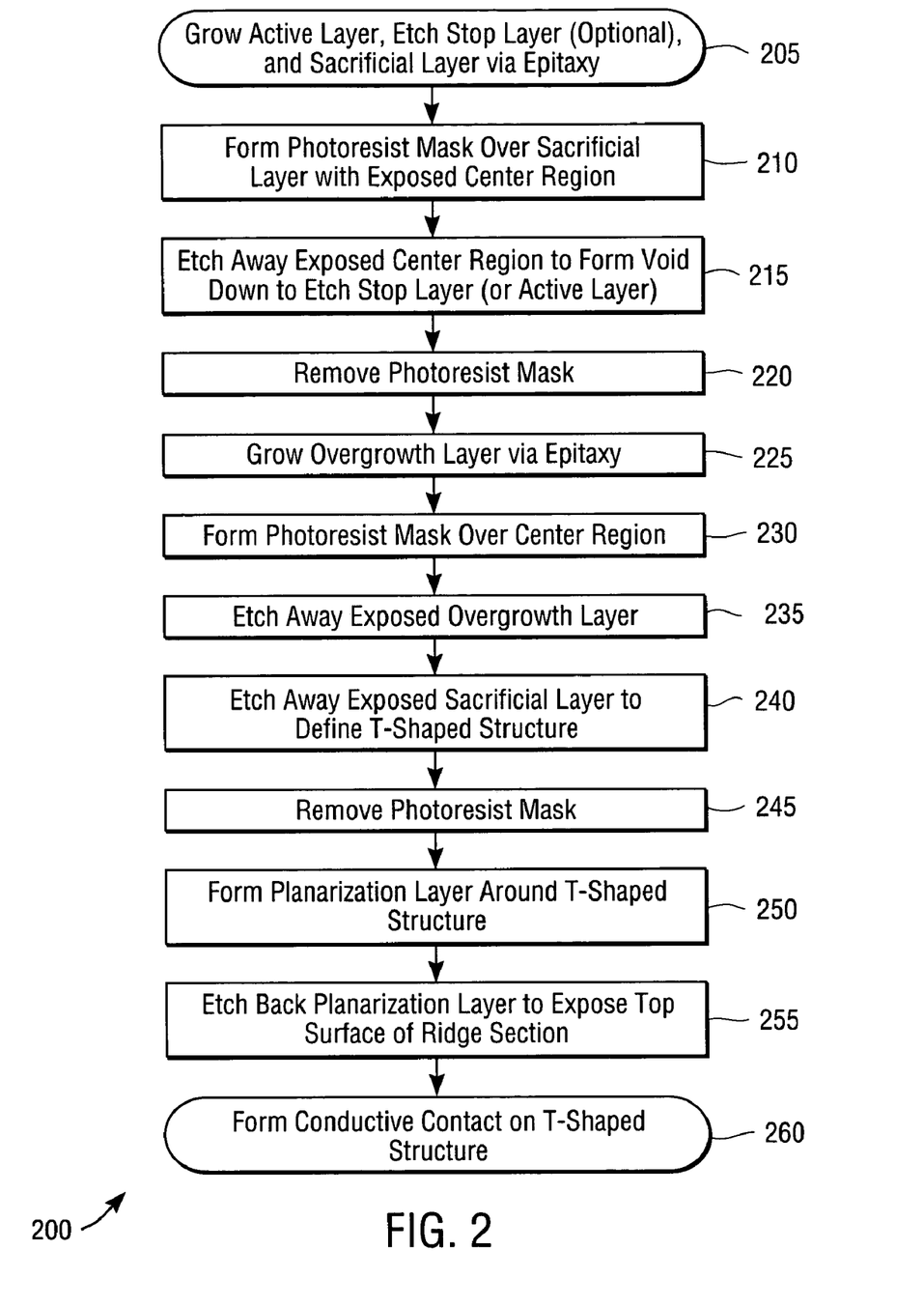
FIG. 2 is a flow chart illustrating a process to fabricate a semiconductor device having a low resistance T-shaped ridge structure, in accordance with an embodiment of the present invention.

FIG. 2 is a flow chart illustrating a process 200 to fabricate semiconductor device 100, in accordance with an embodiment of the present invention. Process 200 is explained below with reference to FIG. 3-FIG. 10.

Figure 3:
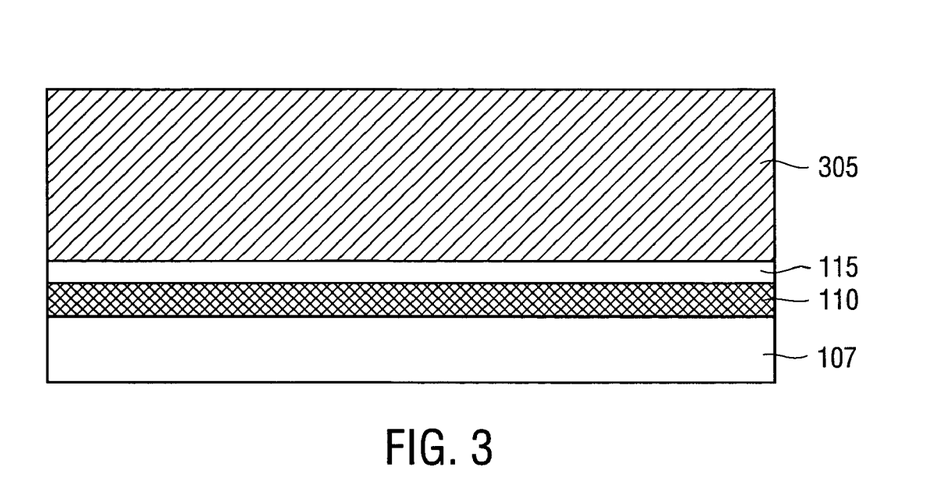
FIG. 3 is a block diagram illustrating a first stage of fabricating a low resistance T-shaped ridge structure including growing multiple semiconductor layers via epitaxy, in accordance with an embodiment of the present invention.

In a process block 205, active layer 110, etch stop layer 115, and a sacrificial layer 305 are formed over substrate layer 107, as illustrated in FIG. 3. In one embodiment, each of these layers is sequentially deposited on top of the other layer via a process known as Metal Organic Chemical Vapor Deposition ("MOCVD"). MOCVD uses epitaxy to grow a crystalline substance on a crystalline substrate. The crystalline substance grows with a lattice structure that mimics the orientation of the underlying lattice structure of the crystalline substrate. Other epitaxy techniques for crystal layer growth may be used in place of or in conjunction with MOCVD, such as Molecular Beam Epitaxy ("MBE"), Chemical Beam Epitaxy ("CBE"), and Liquid Phase Epitaxy ("LPE").

In one embodiment, substrate layer 107 is a semiconductor material, such as for example, type III-V semiconductor compounds including Gallium-Arsenide ("GaAs") or Indium Phosphide ("InP"). Typically, substrate layer 107 is an N-type material, though embodiments of the present invention include substrate layer 107 formed of a P-type material. In one embodiment, substrate layer 107 is a semi-insulating material. A semi-insulating material may include a semiconductor material (e.g., III–V semiconductors) having a deep donor, such as Iron. Substrate layer 107 may optionally include a buffer layer (not shown), often included to deal with imperfections on the surface of a polished wafer to provide a better surface to grow the subsequent layers.

In one embodiment, active layer 110 is a semiconductor material layer. Active layer 110 can be made of either a N-type material, a P-type material, or an intrinsic material and may be selected according to design needs and/or the process used (e.g., PMOS, NMOS, CMOS, etc.) For the purposes of this discussion, and not by way of limitation, it will be assumed active layer 110 is an intrinsic semiconductor layer, such as for example InGaAs or InGaAsP. In an embodiment where substrate layer 107 is InP, active layer 110 may include any one of InGaAs, InGaAsP, InGaNAs, InGaAls, InAs, and the like. In an embodiment where substrate layer 107 is GaAs, active layer 107 may include any one of InGaAs, GaAs, InGaNAs, InGaAlAs, InAs, and the like.

Etch stop layer 115 is an optional layer, which aids in the fabrication of T-shaped ridge structure 105. In one embodiment, etch stop layer 115 is formed of the same material as substrate layer 107. In one embodiment, etch stop layer 115 is InP.

Sacrificial layer 305 is also a layer, which aids in the fabrication of T-shaped ridge structure 105. Sacrificial layer 305 is formed of a material, different from etch stop layer 115 that is reactive with an etching substance that is non-reactive with etch stop layer 115. For example, sacrificial layer 115 may be formed of InGaAsP or InGaAs.

Figure 4:
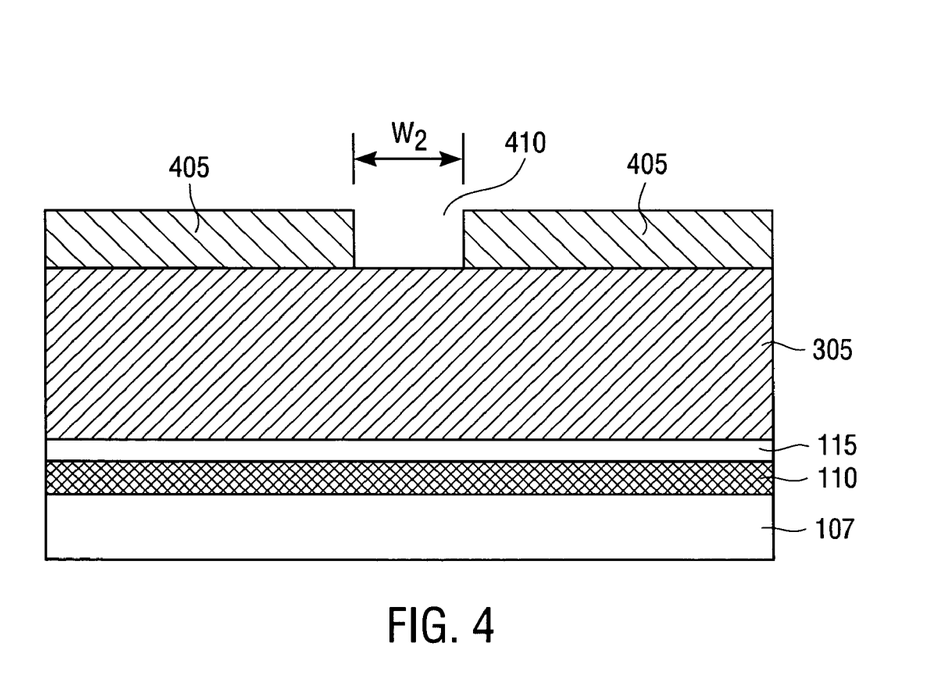
FIG. 4 is a block diagram illustrating a second stage of fabricating a low resistance T-shaped ridge structure including forming a photoresist to etch a void, in accordance with an embodiment of the present invention.

In a process block 210 (FIG. 2), a photoresist mask 405 is formed over sacrificial layer 305, as illustrated by FIG. 4. Photoresist mask 405 is formed to expose a center region 410 having a width $W_2$ over sacrificial layer 305.

Figure 5:
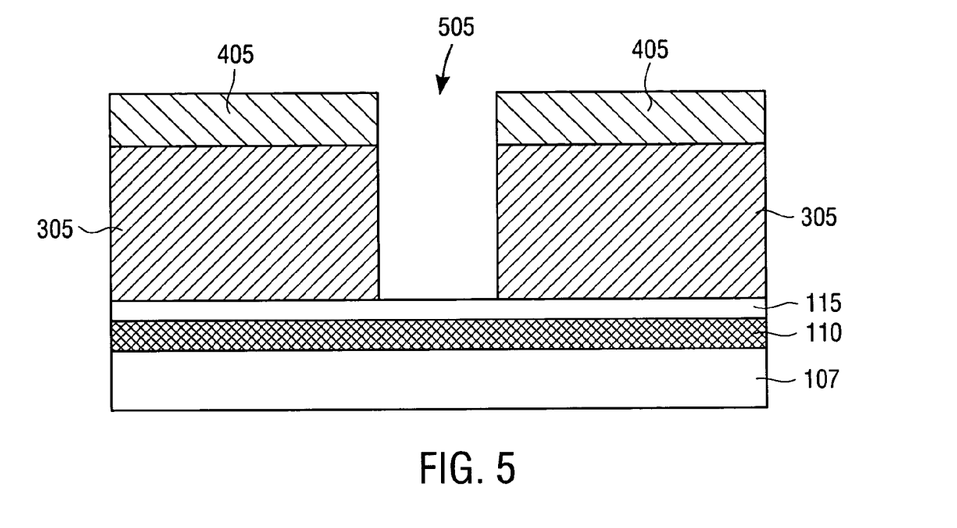
FIG. 5 is a block diagram illustrating a third stage of fabricating a low resistance T-shaped ridge structure including etching out a void in a sacrificial layer, in accordance with an embodiment of the present invention.

In a process block 215 (FIG. 2), a void 505 is defined within sacrificial layer 305, as illustrated by FIG. 5. Void 505 may be defined via processes called dry etching or wet etching. In one embodiment, void 505 is a vertical channel within sacrificial layer 305 having a width $W_2$ and a length L. In one embodiment, void 505 runs the entire depth of sacrificial layer 305 and terminates at etch stop layer 115. In one embodiment, void 505 is formed using an etching substance that is reactive with sacrificial layer 115, but non-reactive with etch stop layer 115. The etching substance used to define void 505 may include a mixture of $H_2SO_4$, $H_2O_2$, or $H_2O$. For example, if sacrificial layer 305 is InGaAsP and etch stop layer 115 is InP, then the aforementioned etching substance will react with sacrificial layer 305 to define void 505, but will not etch through etch stop layer 115. An appropriate depth of void 505 may be selected depending upon design constraints based on the particular implementation. It should be appreciated that other known techniques capable of etching a vertical channel may be implemented to define void 505, within the spirit of the present invention. In some instances, known techniques of etching channels of a specified depth may not require use of etch stop layer 115. Thus, in some embodiments, etch stop layer 115 is optional.

Figure 6:
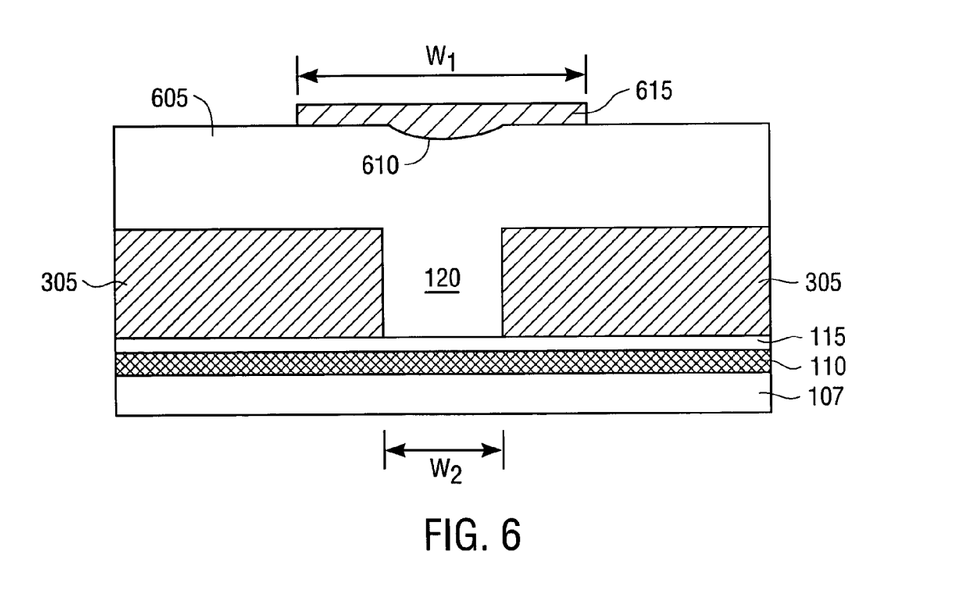
FIG. 6 is a block diagram illustrating a forth stage of fabricating a low resistance T-shaped ridge structure including growing an overgrowth layer, in accordance with an embodiment of the present invention.

In a process block 220 (FIG. 2), photoresist mask 405 is removed using known techniques. Once void 505 has been defined in sacrificial layer 305 and photoresist mask 405 removed, an overgrowth layer 605 may be formed to fill in void 505 and overlay remaining portions of sacrificial layer 305 (process block 225), as illustrated in FIG. 6. Overgrowth layer 605 may be epitaxially grown using MOCVD techniques. A dimple channel 610 results on the surface of overgrowth layer 605 over the area where void 505 was filled as a result of the epitaxy growth process. In one embodiment, overgrowth layer 605 is formed of the same material as etch stop layer 115. Although FIG. 6 illustrates overgrowth layer 605 and etch stop layer 115 as being distinct, in one embodiment overgrowth layer 605 is epitaxially grown from etch stop layer 115 using the same material as etch stop layer 115 and therefore will be indistinguishable from etch stop layer 115. Etch stop layer 115 has been illustrated as distinct from overgrowth layer 605 for the purposes of discussion.

In one embodiment, overgrowth layer 605 is formed of P-doped InP; however, other materials may be used and overgrowth layer 605 may even be N-doped, undoped, or alternate/mixed doped. In an embodiment where active layer 110 is an intrinsic material, overgrowth layer 605 and etch stop layer 115 are P-type material, and substrate layer 107 is an N-type material, a P-I-N junction is formed having associated depletion regions at the interfaces. This P-I-N junction may be used to form any number of semiconductor devices in active layer 110, as discussed above. In one embodiment, overgrowth layer 605 and etch stop layer 115 are appropriately doped at their interface with active layer 110 according to design requirements. However, in this embodiment, doping concentrations of overgrowth layer 605 may increase towards the top of overgrowth layer 605 to decrease its internal resistance and provide good ohmic contact at its surface.

In a process block 230 (FIG. 2), another photoresist mask 615 is formed on overgrowth layer 605 over shank section 120. Although FIG. 6 illustrates photoresist mask 615 as centered over shank section 120, it should be appreciated that embodiments of the present invention include forming photoresist mask 615 off center of shank section 120, as discussed above. Photoresist mask 615 has a width $W_1$ which is greater than width $W_2$ of shank section 120. Generally, $W_1$ may range between 6 µm to 20 µm, while $W_2$ may only be approximately 2 µm. However, it should be appreciated that these dimensions are for demonstrative purposes only and may vary according to the design considerations and constraints. Width $W_2$ may depend upon factors, such as, gate width of a transistor or width of a planar waveguide to ensure single mode propagation. Length L of T-shaped ridge structure 105 (see FIG. 1) also will vary depending upon the particular implementation of semiconductor device 100. For example, in the case of a laser diode length L may range from 200 µm to 500 µm.

Figure 7:
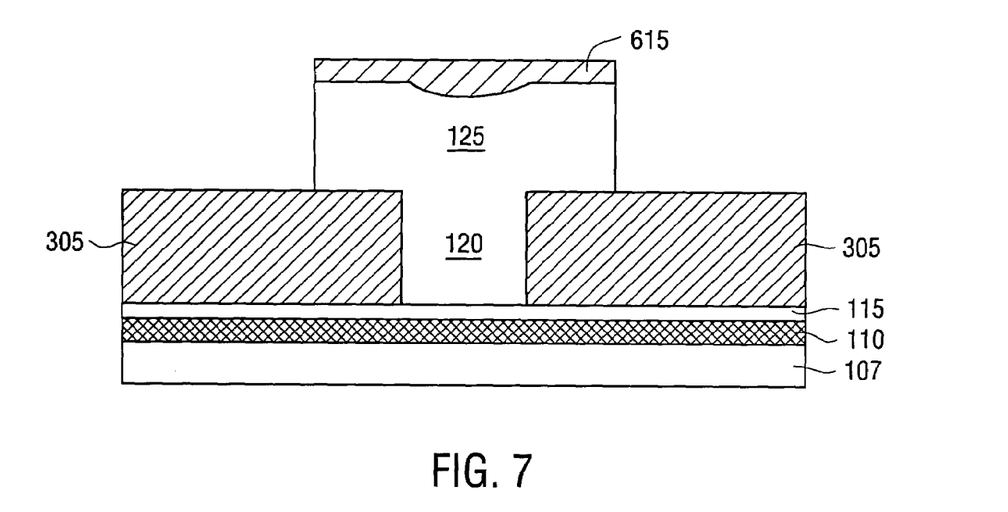
FIG. 7 is a block diagram illustrating a fifth stage of fabricating a low resistance T-shaped ridge structure including etching away portions of an overgrowth layer, in accordance with an embodiment of the present invention.

In a process block 235 (FIG. 2), exposed portions of overgrowth layer 605, are etched away using an etching substance to define ridge section 125 (see FIG. 7). In one embodiment, the etching substance used to define ridge section 125 includes a mixture of hydrochloric acid ("HCl") and phosphoric acid ("$H_3PO_4$"). In an alternative embodiment, overgrowth layer 605 is dry etched with a mixture of gases $CH_4$, $H_2$, and Ar in an RF plasma. Etching away exposed portions of overgrowth layer 605 once again exposes remaining portions of sacrificial layer 305.

Figure 8:
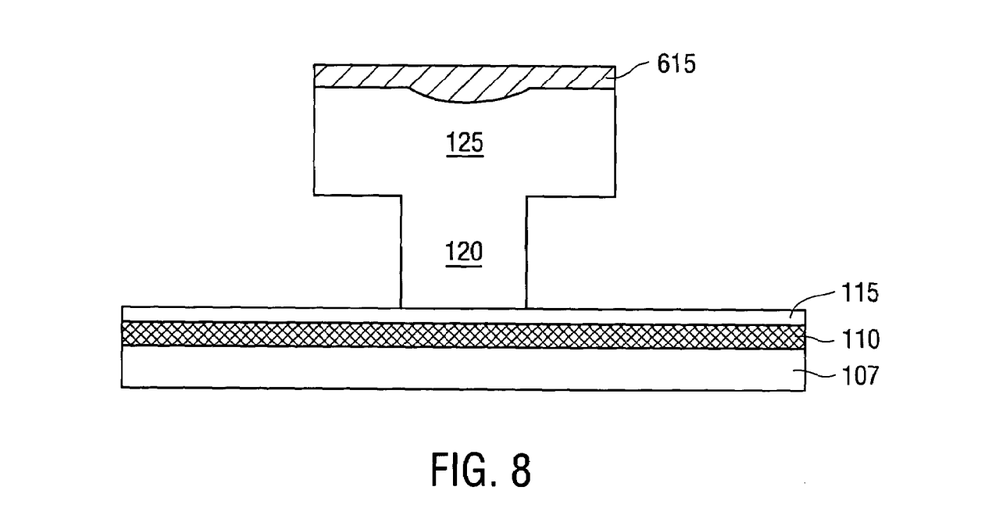
FIG. 8 is a block diagram illustrating a sixth stage of fabricating a low resistance T-shaped ridge structure including etching away portions of a sacrificial layer, in accordance with an embodiment of the present invention.

In a process block 240 (FIG. 2), the remaining portions of sacrificial layer 305 are removed (see FIG. 8). In one embodiment, the same etching substance as used in process block 215 is used to etch away the remaining portions of sacrificial layer 305. Removing the remaining portions of sacrificial layer 305 defines shaft section 120.

Figure 9A:
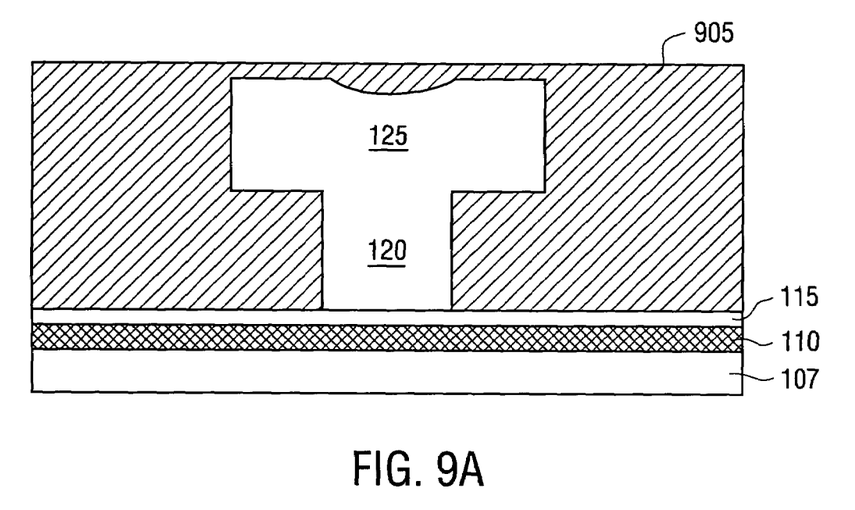
FIG. 9A is a block diagram illustrating a seventh stage of fabricating a low resistance T-shaped ridge structure including forming a planarization layer around the low resistance T-shaped ridge structure, in accordance with an embodiment of the present invention.

In a process block 245 (FIG. 2), photoresist mask 615 is removed to expose ridge section 125. In a process block 250 (FIG. 2), a planarization layer 905 is formed around T-shaped structure 105 to passivate the underlying layers and to provide a flat surface for subsequent layers to be formed over substrate layer 107, as illustrated in FIG. 9A. In one embodiment, planarization layer 905 is a polymer material having a low dielectric constant. In one embodiment, planarization layer 905 is an oxide material. It should be appreciated that any insulating dielectric material may be used to form planarization layer 905. However, forming planarization layer 905 using a material having a low dielectric constant minimizes capacitive coupling between active layer 110 and T-shape ridge structure 105, later deposited conductive contact 1005, and later deposited electrical interconnect 1010. Reducing parasitic capacitances is important for high frequency electro-optical devices.

Figure 9B:
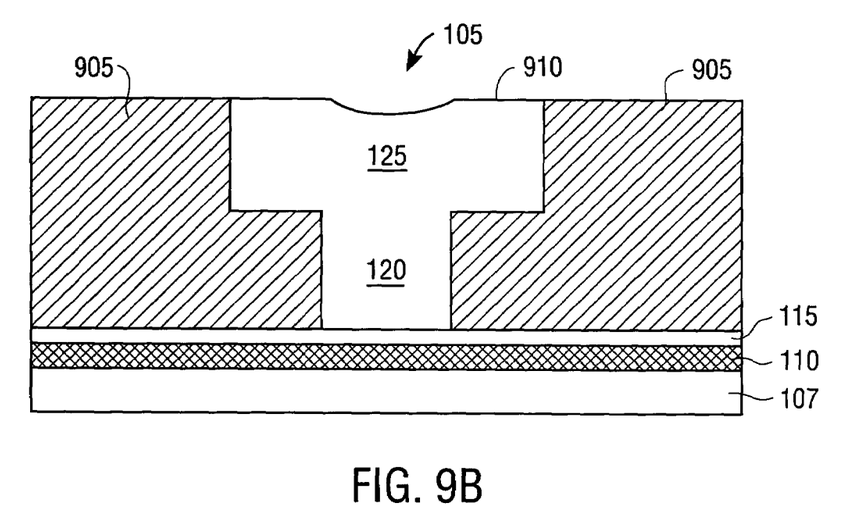
FIG. 9B is a block diagram illustrating an eighth stage of fabricating a low resistance T-shaped ridge structure including etching back a planarization layer to expose a top surface of the T-shaped ridge structure, in accordance with an embodiment of the present invention.

In a process block 255 (FIG. 2), planarization layer 905 is etched back to be approximately flush with a top surface 910 of ridge section 125, as illustrated in FIG. 9B. Once top surface 910 is exposed, a conductive contact 1005 is formed over ridge section 125, in a process block 260 and illustrated in FIG. 10. Conductive contact 1005 provides a low resistance coupling to T-shaped ridge structure 105 for an electrical interconnect 1010. In one embodiment, conductive contact 1005 is a sequence of metal layers, such as Titanium/Platinum/Gold or the like. In an alternative embodiment, top surface 910 of ridge section 125 can be highly doped to provide a conductive surface and electrical interconnect 1010 coupled directly thereto. However, the fabrication process can limit the level of doping in ridge section 125. Generally, electrical interconnect 1010 is a metal trace, but may also include a polysilicon trace, wires, bonding pads, highly doped semiconductor material and other conductive interconnects.

In one GaAs/AlGaAs embodiment of semiconductor device 100, the individual layers may be made of the following materials: substrate 107 formed of GaAs, substrate buffer layer (not shown) formed of AlGaAs, active layer 110 formed of GaAs, etch stop layer 115 formed of AlGaAs (or AlAs), sacrificial layer 305 formed of GaAs, shaft section 120 and ridge section 125 formed of AlGaAs. An etching substance made of a mixture of $C_6H_8O_7$ and $H_2O_2$ or a mixture of $NH_4OH$ and $H_2O_2$ may be applied to selectively etch GaAs layers without etching AlGaAs layers, as described above. A mixture of $H_2SO_4$, $H_2O_2$, and $H_2O$ can etch both GaAs and AlGaAs. Other etchants may be used to selectively etch GaAs or AlGaAs as is known in the art.

Figure 11:
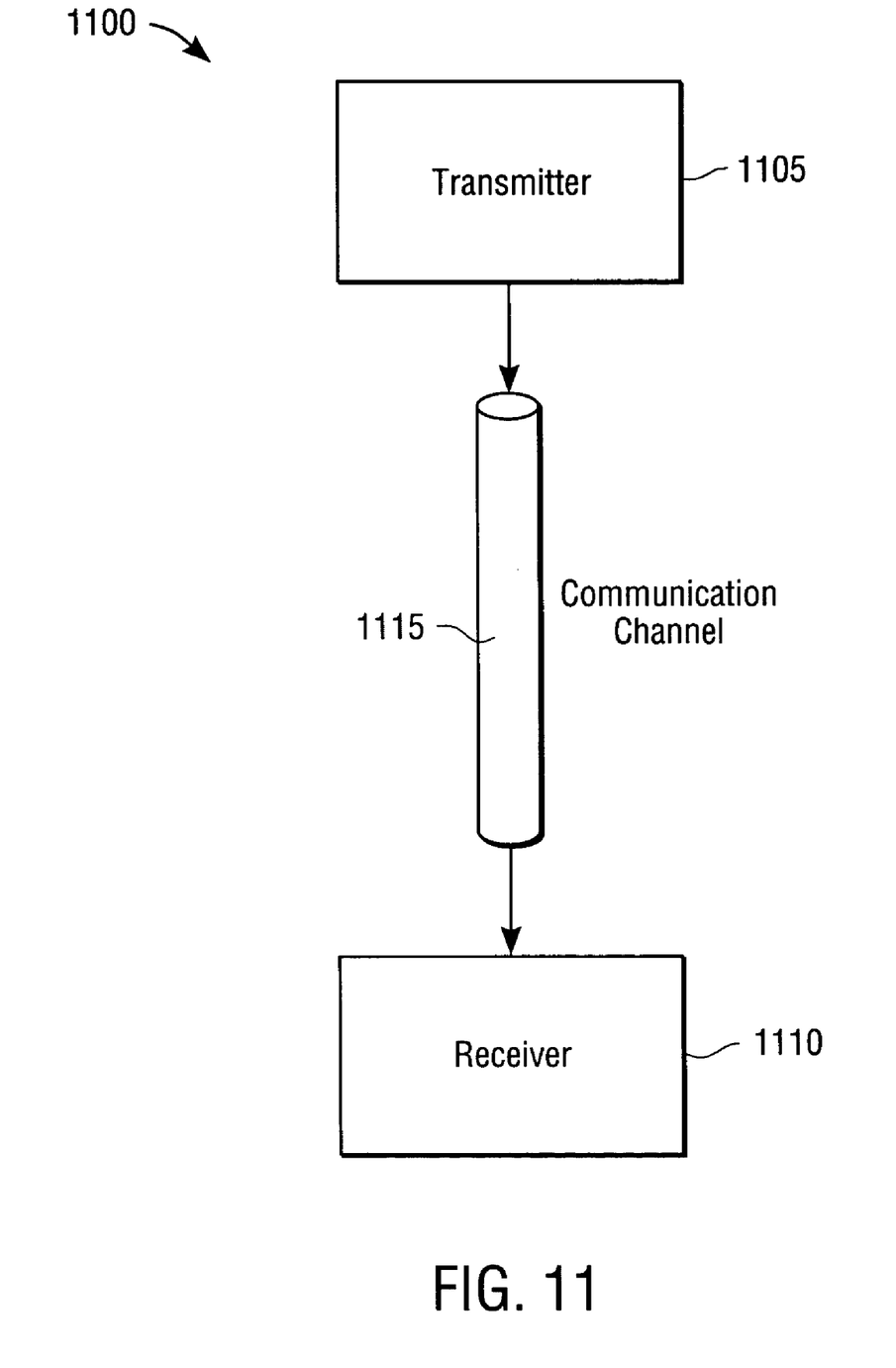
FIG. 11 is a block diagram illustrating a communication system including a laser diode and a photo detector using a low resistance T-shaped ridge structure, in accordance with an embodiment of the present invention.

FIG. 11 is a block diagram illustrating a communication system 1100 including a transmitter 1105, a receiver 1110, and a communication channel 1115. Transmitter 1105 is optically coupled to communication channel 1115 to generate an optical signal 1120 and to transmit optical signal 1120 thereto. Receiver 1110 is optically coupled to communication channel 1115 to receive optical signal 1120 therefrom. In one embodiment, communication channel 1115 is a waveguide, such as a planar waveguide in a semiconductor substrate, an optic fiber, free space, and the like.

In one embodiment, transmitter 1105 includes semiconductor device 100 configured to function as a laser diode. In this case, active layer 110 of semiconductor device 100 would include a gain medium and possibly a resonance cavity. In one embodiment, receiver 1110 includes semiconductor device 100 configured to function as a photodiode. It should be appreciated that embodiments of transmitter 1105 and receiver 1110 could further include semiconductor devices to enable transceiver functionality. In a transceiver embodiment, both transmitter 1105 and receiver 1110 could each include multiple semiconductor devices 100, one configured as a laser diode and the other configured as a photodiode.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the claims. Rather, the scope of the invention is to be determined entirely by the following claims, which are to be construed in accordance with established doctrines of claim interpretation.

What is claimed is:

1. A method, comprising:
defining a void in a sacrificial layer proximate to an active layer with a first etching substance reactive with the sacrificial layer, wherein the first etching substance comprises a mixture of $H_2SO_4$, $H_2O_2$, and $H_2O$;
forming an overgrowth layer in the void and over portions of the sacrificial layer adjacent to the void, wherein the overgrowth layer comprises one of InP or AlGaAs;
defining a ridge section in the overgrowth layer with a second etching substance reactive with the overgrowth layer and substantially non-reactive with the sacrificial layer, wherein the second etching substance comprises a mixture of hydrochloric acid (HCl) and phosphoric acid ($H_3PO_4$; and
removing portions of the sacrificial layer to define a shank section in the overgrowth layer under the ridge section, the ridge section having a greater lateral dimension than the shank section to reduce electrical resistance between the active layer and electrical interconnects to be electrically coupled to the ridge section.

2. The method of claim 1, further comprising forming an etch stop layer between the active layer and the sacrificial layer, the etch stop layer being non-reactive with the first etching substance.

3. The method of claim 1 wherein removing portions of the sacrificial layer to define the shank section in the overgrowth layer comprises etching away the portions of the sacrificial layer with the first etching substance.

4. The method of claim 1, further comprising forming a planarization layer around the shank section and the ridge section of the overgrowth layer, the planarization layer comprising a polymer.

5. The method of claim 4, further comprising forming a conductive contact on top of the ridge section, the conductive contact to couple the electrical interconnects to the ridge section.

6. The method of claim 1 wherein the overgrowth layer comprises a P-doped semiconductor material and the active layer comprises an intrinsic semiconductor material.

7. The method of claim 6 wherein the intrinsic semiconductor comprises one of InGaAsP, InGaAs, or GaAs.

8. The method of claim 1 wherein the ridge and shank sections of the overgrowth layer form a substantially T-shaped ridge structure.

9. The method of claim 6, further comprising forming the sacrificial layer over an N-doped substrate layer, wherein the shank section of the overgrowth layer, the active layer, and the N-doped substrate layer form a P-I-N junction.

10. A method, comprising:
defining a void in a sacrificial layer proximate to an active layer with a first etching substance reactive with the sacrificial layer;
forming an overgrowth layer in the void and over portions of the sacrificial layer adjacent to the void;
defining a ridge section in the overgrowth layer with a second etching substance reactive with the overgrowth layer and substantially non-reactive with the sacrificial layer; and
removing portions of the sacrificial layer to define a shank section in the overgrowth layer under the ridge section, the ridge section having a greater lateral dimension than the shank section to reduce electrical resistance between the active layer and electrical interconnects to be electrically coupled to the ridge section.

11. The method of claim 10 wherein defining the void in the sacrificial layer comprises etching the sacrificial layer.

12. The method of claim 10, further comprising forming an etch stop layer between the active layer and the sacrificial layer, the etch stop layer being non-reactive with the first etching substance.

13. The method of claim 10 wherein removing portions of the sacrificial layer to define the shank section in the overgrowth layer comprises etching away the portions of the sacrificial layer with the first etching substance.

14. The method of claim 10, further comprising forming a planarization layer around the shank section and the ridge section of the overgrowth layer, the planarization layer comprising a polymer.

15. The method of claim 14, further comprising forming a conductive contact on top of the ridge section, the conductive contact to couple the electrical interconnects to the ridge section.

16. The method of claim 10 wherein the overgrowth layer comprises a P-type semiconductor material and the active layer comprises an intrinsic semiconductor material.

17. The method of claim 16 wherein the P-type semiconductor material comprises one of InP and AlGaAs, and wherein the intrinsic semiconductor comprises one of InGaAsP, InGaAs, and GaAs.

18. The method of claim 17 wherein the first etching substance comprises a mixture of at least two of $H_2SO_4$, $H_2O_2$, and $H_2O$, and wherein the second etching substance comprises a mixture of hydrochloric acid (HCl) and phosphoric acid ($H_3PO_4$).

19. The method of claim 10 wherein the ridge and shank sections of the overgrowth layer form a substantially T-shaped ridge structure.

20. A method, comprising:
defining a void in a sacrificial layer proximate to an active layer with a first etching substance reactive with the sacrificial layer;
forming an overgrowth layer in the void and over portions of the sacrificial layer adjacent to the void;
defining a ridge section in the overgrowth layer with a second etching substance reactive with the overgrowth layer and substantially non-reactive with the sacrificial layer;
removing portions of the sacrificial layer to define a shank section in the overgrowth layer under the ridge section, the ridge section having a greater lateral dimension than the shank section to reduce electrical resistance between the active layer and electrical interconnects to be electrically coupled to the ridge section; and
forming a planarization layer around the shank section and the ridge section of the overgrowth layer, the planarization layer comprising a polymer.

21. The method of claim 20, further comprising forming an etch stop layer between the active layer and the sacrificial layer, the etch stop layer being non-reactive with the first etching substance.

22. The method of claim 21 wherein removing portions of the sacrificial layer to define the shank section in the overgrowth layer comprises etching away the portions of the sacrificial layer with the first etching substance.

23. The method of claim 20, further comprising forming a conductive contact on top of the ridge section, the conductive contact to couple the electrical interconnects to the ridge section.

24. The method of claim 20 wherein the overgrowth layer comprises a P-type semiconductor material and the active layer comprises an intrinsic semiconductor material.

25. The method of claim 20 wherein the ridge and shank sections of the overgrowth layer form a substantially T-shaped ridge structure.

* * * * *